US006469529B1

(12) United States Patent
Bruce et al.

(10) Patent No.: US 6,469,529 B1
(45) Date of Patent: Oct. 22, 2002

(54) TIME-RESOLVED EMISSION MICROSCOPY SYSTEM

(75) Inventors: Michael R. Bruce; Rama R. Goruganthu, both of Austin; Glen Gilfeather, Del Valle, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/580,716

(22) Filed: May 30, 2000

(51) Int. Cl.[7] ............................................. G01R 31/302
(52) U.S. Cl. ...................................... 324/752; 324/750
(58) Field of Search ................................ 324/750, 751, 324/752; 438/14; 382/145, 149

(56) References Cited

U.S. PATENT DOCUMENTS

| | | | | | |
|---|---|---|---|---|---|
| 4,843,329 | A | * | 6/1989 | Beha et al. ................. | 324/752 |
| 5,451,863 | A | * | 9/1995 | Freeman ..................... | 324/752 |
| 5,523,694 | A | * | 6/1996 | Cole, Jr. ..................... | 324/751 |
| 5,598,100 | A | * | 1/1997 | Maeda et al. ............... | 324/750 |
| 5,905,577 | A | * | 5/1999 | Wilsher et al. .............. | 324/752 |
| 5,940,545 | A | * | 8/1999 | Kash et al. .................. | 318/312 |
| 6,255,124 | B1 | * | 7/2001 | Birdsley ...................... | 438/14 |

OTHER PUBLICATIONS

Kash, J.A., and Tsang, J.C.; Dynamic Internal Testing of CMOS Circuits Using Hot Luminescence; IEEE Electron Device Letters, vol. 18, No. 7, p. 330; Jul. 1997.

Firmani, C., et al.; High–Resolution Imaging with a Two–Dimensional Resistive Anode Photon Counter; Rev. Sci. Instrum., vol. 53, No. 5; May 1982.

Charbonneau, S., et al.; Two–Dimensional Time–Resolved Imaging with 100–ps Resolution Using a Resistive Anode Photomultiplier Tube; Rev. Sci. Instrum., vol. 63, No. 11; Nov. 1992.

Cova, S., Lacaita, A., Zappa, F., and Lovati, P.; Avalanche Photodiodes for Near–Infrared Photon–Counting; Advances in Fluorescence Sensing Technology II, vol. 2388, Feb. 1995.

Cova, S., Lacaita, A., Ghioni, M., and Ripamonti, G.; 20–ps Timing Resolution with Single–Photon Avalanche Diodes; Rev. Sci. Instrum., vol. 60, No. 6, Jun. 1989.

Hu, Chenming, et al.; Hot–Electron–Induced MOSFET Degradation—Model, Monitor, and Improvement; IEEE Transactions on Electron Devices, vol. 32, No. 2, Feb. 1985.

Bruce, V.J., Energy Resolved Emission Microscope; IEEE/IRPS, Aug. 1993.

Kash, J.A., and Tsang, J.C., Hot Luminescence from CMOS Circuits: A Picosecond Probe of Internal Timing; IBM Research Division, Yorktown Heights, NY.

Shade, Gary F., Physical Mechanisms for Light Emission Microscopy; Ford Microelectonics, Inc.

(List continued on next page.)

Primary Examiner—Michael Sherry
Assistant Examiner—Jermele Hollington

(57) ABSTRACT

Integrated circuit devices are analyzed using an integrated system adapted to obtain time-resolved information from the back side of a silicon based semiconductor chip using hot carrier emissions. According to an example embodiment of the present invention, a system is adapted to analyze a semiconductor device under test (DUT) using a plurality of sensors mounted to a microscope having an objective lens. The plurality of sensors include a global acquisition sensor, a single-point acquisition sensor, and a navigation sensor. The integrated system is adapted to use the plurality of sensors individually and simultaneously. The integrated system improves the analysis of the DUT for reasons including that it makes possible the performance of more than one type of analysis simultaneously using a single test arrangement.

40 Claims, 3 Drawing Sheets

OTHER PUBLICATIONS

Hawkins, Charles F., Soden, Jerry M., Cole, Jr., Edward I., Snyder, Eric S., The Use of Light Emission in Failure Analysis of CMOS ICs; The University of New Mexico and Sandia National Laboratories.

Lacaita, A., Cove, S., Zappa, F. and Francese, P.A., Sub-nanosecond Single–Photon Timing With Commercially Available Germanium Photodiodes; Optics Letters, vol. 18, No. 1, Jan. 1993.

Lacaita, Andrea L., Zappa, Franco, Bigliardi, Stefano, and Manfredi, Manfredo, On The Bremsstrahlung Origin Of Hot–Carrier–Induced Photons In Silicon Devices; IEEE Transaction on Electron Devices, vol. 40, No. 3, Mar. 1993.

Uraoka, Yukiharu, Tsutsu, Noriko, Morii, Tomoyuki, and Tsuji, Kazuhiro, Hot Carrier Evaluation of MOSFET's in ULSI Circuits Using the Photon Emission Method; IEEE Transaction on Electron Devices, vol. 40, No. 8, Aug. 1993.

Kash, J.A., and Tsang, J.C., Full Chip Optical Imaging of Logic State Evolution in CMOS Circuits; Thomas J. Watson Research Center, IBM Research Division, 1996.

Tsang, J.C., and Kash, J.A., Picosecond Hot Electron Light Emission From Submicron Complementary Metal–Oxide–Semiconductor Circuits; Applied Physics Letter, vol. 70, No. 7, Feb. 1997.

Dautet, Henri et al. Photon Counting Techniques With Silicon Avalanche Photodiodes; Applied Optics, vol. 32, No. 21, Jul. 1993.

Lacaita, A., Zappa, F. Cove, S., and Lovati, P., Single–Photon Detection Beyond 1μm: Performance of Commercially Available InGaAs/InP Detectors; Applied Optics, vol. 35, No. 16, Jun. 1996.

* cited by examiner

TIME-RESOLVED EMISSION MICROSCOPY SYSTEM

RELATED PATENT DOCUMENTS

The present invention is related to U.S. patent application Ser. No. 09/409,088, filed on Sep. 30, 1999 and entitled "Quadrant Avalanche Photodiode Time-resolved Detection", which is a continuation-in-part of U.S. patent application Ser. No. 09/205,589, filed on Dec. 4, 1998 and entitled "Single Point High Resolution Time Resolved Photoemission Microscopy System and Method", which are hereby fully incorporated by reference.

FIELD OF THE INVENTION

The present invention relates generally to semiconductor wafers and their fabrication and, more particularly, to semiconductor wafers and their manufacture involving techniques for analyzing the wafers.

BACKGROUND OF THE INVENTION

The semiconductor industry has recently experienced technological advances that have permitted dramatic increases in integrated circuit density and complexity, and equally dramatic decreases in power consumption and package sizes. Present semiconductor technology now permits single-chip microprocessors with many millions of transistors, operating at speeds of hundreds of millions of instructions per second to be packaged in relatively small, air-cooled semiconductor device packages.

A by-product of such high-density and high functionality is an increased demand for products employing these microprocessors and devices for use in numerous applications. As the use of these devices has become more prevalent, the demand for faster operation and better reliability has increased. Such devices often require manufacturing processes that are highly complex and expensive.

As the manufacturing processes for semiconductor devices and integrated circuits increase in difficulty, methods for testing and debugging these devices become increasingly important. Not only is it important to ensure that individual chips are functional, it is also important to ensure that batches of chips perform consistently. In addition, the ability to detect a defective manufacturing process early is helpful for reducing the number of defective devices manufactured.

Various types of semiconductor devices and manufacturing systems require or benefit from one or more test, debug, or other analysis methods. Some structures are analyzed using several equipment types and/or methods, depending upon the type of information that is sought. In order to obtain different kinds of information, it is often desirable to test a particular semiconductor structure using multiple tools and/or analysis methods.

One type of analysis that can be performed is based upon hot carrier emissions, such as photons typically emitted from CMOS inverters during a logic state change. However, these emissions occur on time scales faster than 100 ps in modem integrated circuits. Therefore, a fast (greater than 100 ps) detector is necessary for recording these events. In addition, many devices from which the emissions are detected are often located in close proximity, necessitating a detector having high spatial resolution. For instance, current semiconductor technology permits the formation of transistors having a pitch on a micron or even sub-micron order.

There are various detectors and detection methods that are available for hot carrier emission analysis. For instance, a global detector allows parallel acquisition and fast timing resolution of the emissions, but has poor quantum efficiency. A single point avalanche photodiode (APD) detector has high quantum efficiency for fast acquisition but has slow time response. (Quantum efficiency is the ratio of hole-electron pairs or photoelectrons to the number of photons received by a photodetector. In general, the quantum efficiency can be as high as 80% for an APD and 25% for a PMT). A germanium (Ge), Gallium Arsenide (GaAs), or Indium Gallium Arsenide (InGaAs) APD can be added to speed acquisition, but each also generally exhibits a slow time response. For information regarding an example global detector, reference may be made to J. A. Kash and J. C. Tsang, Dynamic Internal Testing of CMOS Circuits using Hot Luminescence," IEEE ELECTRON DEVICE LETT., July 1997, vol. 18, at 330 and to U.S. Pat. No. 5,940,545 entitled "Noninvasive Optical Method for Measuring Internal Switching and Other Dynamic Parameters of CMOS Circuits." For information regarding an example single point APD detector, reference may be made to U.S. Pat. No. 6,255,124, filed on Feb. 8, 1999.

Although there are various detectors available for acquiring hot carrier emission data, including the examples described above, it is desirable to have the ability to take advantage, in a single combined testing arrangement, of the particular qualities available from currently available detectors and methods. Such a combined testing arrangement would enhance the advancement of semiconductor technologies.

SUMMARY OF THE INVENTION

The present invention is directed to a method and system for analyzing a semiconductor device that provides the ability to take advantage of the positive aspects of more than one type of analysis tool. The present invention is exemplified in a number of implementations and applications, some of which are summarized below.

According to one example embodiment of the present invention, an integrated multi-dector system is adapted to analyze a semiconductor device under test (DUT) using more than one detector. The integrated system includes a microscope having an objective lens, a global acquisition sensor, a single-point acquisition sensor, and a navigation sensor used to align the microscope with the DUT. By integrating navigation, global acquisition, and single-point acquisition capabilities into a single system, a DUT can be efficiently analyzed using detectors having different capabilities, thereby enhancing the ability to analyze the DUT.

According to another example embodiment, the present invention is directed to a method for analyzing a semiconductor device under test (DUT). The DUT is navigated and a microscope having an objective lens is directed to a selected portion of the DUT for analysis. An image of the portion of the DUT is focused using the microscope. The focused image is used for integrated analysis via an integrated tool having the capabilities of acquiring both global emission data and single-point emission data from the DUT.

The above summary of the present invention is not intended to describe each illustrated embodiment or every implementation of the present invention. The figures and detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
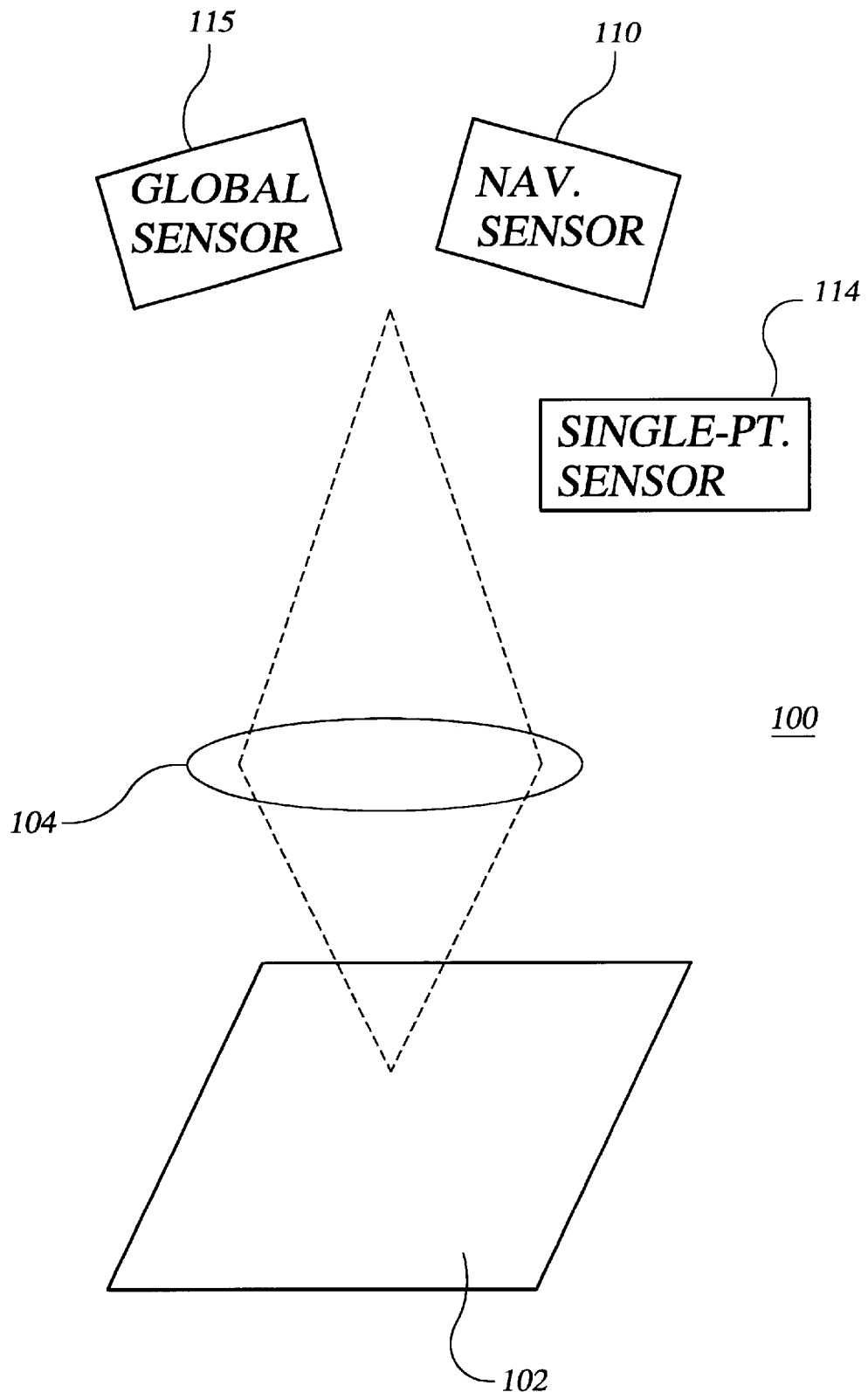
FIG. 1 is system for analyzing a semiconductor device, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor wafers, and the invention has been found to be particularly suited for wafers benefiting or requiring from analysis involving time-resolved emission microscopy. While the present invention is not necessarily limited to such wafers, various aspects of the invention may be appreciated through a discussion of various examples using this context.

The present invention is directed to analysis involving integrated circuits and timing related test structures (inverters, ring oscillators, etc.), such as involving post-manufacturing analysis via the back side of a silicon-based flip-chip. According to an example embodiment of the present invention, an integrated analysis system having multiple detectors (e.g. a near infrared (nIR) navigation camera, a global acquisition sensor, and/or a single-point acquisition sensor) is adapted for selecting one or more of the multiple detectors for a testing application. The detectors may, for example, be used simultaneously or individually for obtaining different information from a DUT. The integrated detectors facilitate acquisition of different kinds of data using a single integrated system. For example, data such as global emissions and fast acquisition of weak single-point emissions can be obtained in an efficient and non-invasive manner. The efficiency is due in part to the ability to use more than one type of analysis device to acquire information simultaneously, and in part to the ability to easily choose between different types of detectors when performing the analysis. In addition, devices having extreme differences in acquisition rates of data can be used. The integration of multiple detectors further enables the detection of emissions from closely-packed devices, such as sub-micron transistors, using high spatial resolution.

FIG. 1 is a block diagram 100 representing an integrated system for analyzing a semiconductor chip, according to another example embodiment of the present invention. A microscope objective 104 is positioned over a DUT 102. The microscope objective may, for example, be a part of a microscope such as a laser scanning microscope, or other microscope suitable for focusing an image from the DUT. A navigation sensor 110 is arranged over the objective 104 and is adapted to navigate and obtain an image from a selected portion of the DUT 102. Once the objective is over the selected portion of the DUT, an image is focused and used for analysis. A global acquisition sensor 115 is adapted to obtain data over the entire field of view of the objective, and a single-point acquisition sensor 114 is adapted to obtain data from a single node in the DUT, such as from a transistor. Each of the sensors 115 and 114 may be used individually or simultaneously. The data obtained via the sensors is used for analyzing the DUT, such as for obtaining timing data for circuitry including transistors that are responding to an electrical input.

Figure 2:
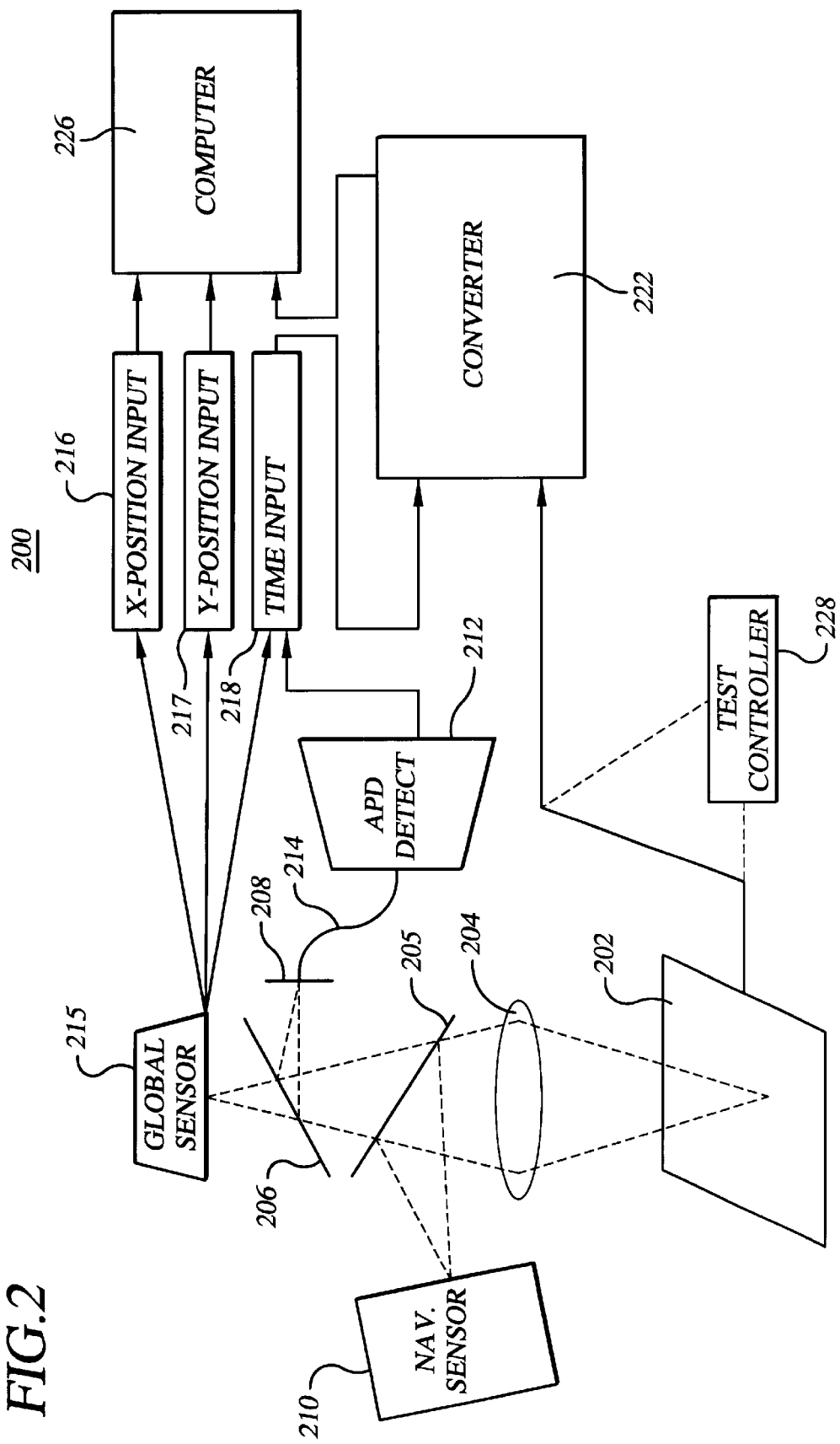
FIG. 2 is another system for analyzing a semiconductor device, according to an example embodiment of the present invention.

According to a more particular example embodiment of the present invention, FIG. 2 shows a block diagram of an example integrated system 200 for analyzing a semiconductor chip. The DUT 202 is positioned in view of microscope objective 204 that is part of a laser scanning microscope (not shown) for positioning the DUT 202 to view a selected area of the device. In one implementation, the DUT 202 is positioned on a testing arrangement 203 adapted to hold the DUT. The microscope objective 204 is an objective, such as a near infrared objective, that facilitates viewing through the back side of the DUT 202. Other types of microscopes, such as compound or metallurgical microscopes, can also be used to gather data including hot carrier emission data from the device. For example, the Zeiss Axiotron and Olympus VANOX-T may be suitable for this application.

Beam splitters 205 and 206, such as a cube-type beam splitter, are arranged over the objective 204 and adapted to split the beam (or image) from the DUT. Other beam splitters that are capable of transmitting near infrared (nIR) light would also be suitable, such as a Plate beam splitter or a Pellicle Beamsplitter. The beam splitters may also include a three-position slider adapted to function in beam splitter, mirror, and pass-through modes. The beam splitter mode causes a portion of the beam to be split, the mirror mode reflects the entire beam, and the pass-through mode passes the entire beam. The beam splitter 205 is positioned to direct a portion of an image of the DUT 202 to a navigation sensor 210, such as a nIR camera. The beam splitter 206 is positioned to direct a portion of an image of the DUT 202 including hot carrier emissions, such as photoemissions, to an aperture element 208.

Another portion of the image is passed through the beam splitter and directed to a position sensitive resistive anode microchannel plate photo-multiplier tube (MCP-PMT) 215 adapted for global acquisition of timing data from the DUT. The MCP-PMT 215 is positioned to receive the focused image data passed through the beam splitters 205 and 206 and is coupled and adapted to provide time and position data to time input 218, Y-position input 217, and X-position input 216. In one particular example embodiment, the beam splitters 205 and 206 are adapted for removal after navigation via the navigation sensor 210 and after the completion of acquisition of image data via the aperture element 208, thereby allowing the full image to be used at the position sensitive MCP-PMT 215.

The aperture element 208 may include a pinhole aperture such as the FO Adapter/Aperture, part number 452735, that is available from Carl Zeiss. The example aperture element has an opening that matches the resolution of the microscope objective 204. Thus, no light is sacrificed with the aperture element and no undesirable additional light is gathered. A fiber optic cable with a small core diameter (e.g., <0.3 microns) could also be used as an aperture. The aperture element 208 is optically aligned with the beam splitter 206 so that emissions from the DUT 202 are directed toward the opening of the aperture element. The size of the opening of the aperture can be selected in accordance with the size of an area of the DUT 202 for which analysis is desired, along with the resolution of the objective 204.

The aperture element 208 is optically coupled via a fiber optic cable 214 to an avalanche photodiode (APD) detector 212 having single photon sensitivity. In one particular example embodiment, the fiber optic cable 214 is a 0.002" glass fiber or, alternatively, a 0.012" diameter bundle of glass fibers, 0.55 NA. Commercially available products are suitable, such as the Fiber Optic Light Pipe with an FC connector and an opaque PVC sheathing from Micro Metrology Systems. The fiber optic cable must be shielded with material that does not permit penetration of external light to the light transmitting fiber. The APD 212 is further coupled to a time input 218 for coupling the acquired timing signal for further use.

The APD detector 212 provides high efficiency single-photon detection using, for example, a single photon counting module such as item SPCM-AQ-151-FC from EG&G CANADA having a specified timing resolution of 300 ps. It will be appreciated that faster detectors can be used to analyze today's circuits in which devices, such as inverters, change state faster than 100 ps. In addition, as technology progresses and state changes occur at faster rates, even faster detectors can be used. Examples of other detectors that can be used include the Hamamatsu R3809U and detectors adapted for use in connection with a fiber optic switching element, such as GaAs, Ge, and InGaAs APD devices; and a very fast non-imaging (25 ps) MCP-PMT. Such switching elements suitable for use in connection with the present invention offer quantum efficiencies (Q.E.) of between about 0.01% and 80% at a wavelength range of between about 2 nm and 900 nm. Integrating these fast acquisition switching elements into the system 200 enables the analysis of devices that change state faster than, for example, 100 ps. APD devices generally have Q.E. set under about 50% to 80%, while MCP-PMT have Q.E. set at about 0.01% to 10%.

A time-to-amplitude converter 222 is coupled to the DUT 202 and to the APD detector 212 and the MCP-PMT sensor 215 via the time input 218. The converter 222 generates an output pulse whose amplitude is directly proportional to the time between the start and stop pulses from the time input 218 and the DUT 202, respectively. For instance, the APD detector 212 generates a start pulse each time a photon is detected, and a clock signal, or trigger signal, from the DUT 202 is used by the time-to-amplitude converter 222 as a stop pulse. The time-to-amplitude converter 222 may, for example, include a converter model TC862 from Oxford. Other suitable converters include the Canberra model 2145.

The output pulse from the converter 222 is delivered to a computer arrangement 26 including a three-parameter multichannel analyzer (MCA) card. Alternatively, the output pulse may be digitized by a conventional analog-to-digital converter (ADC) (not shown), and the digitized pulse can then be provided as input data to a computer 226 via the multi-channel analyzer MCA card. The input data represents the pulse height of the pulse output from the converter 222. The computer/MCA 226 analyzes the digitized pulse height and increases the count of a histogram data point, where the data point is selected based on the pulse height. The computer arrangement 226 is also adapted to receive position data from inputs 216 and 217 that is used for recording global acquisition data from the MCP-PMT. In an alternative embodiment, a time-to-digital converter could be used in place of the time-to-amplitude converter 222, eliminating any need to use an ADC. An example time-to-digital converter is the model 1875 TDC that is available from LeCroy of Chestnut Ridge, N.Y.

In another example embodiment, the integrated system 200 further includes a test controller 228 coupled to the DUT 202 and adapted to provide test signals to the DUT. The test controller 228 may, for example, include conventional hardware and software for configuring and loading test vectors in the DUT 202. The test controller 228 can be used to input test signals that represent normal operating signals for the DUT for design/debug purposes. The controller is further coupled to the time-to-amplitude converter 222, and is used for timing purposes. In a more particular example embodiment, the test controller 228 includes a holder adapted to hold the DUT for analysis.

In another example embodiment (not shown), a solid immersion lens (matching the index of refraction of the silicon substrate) is positioned directly in contact with the surface of the DUT. Such a lens has a finer resolution because minimal air space separates the lens from the device. Thus, the aperture element could have a much smaller opening to allow detection of emissions from very small circuit elements. The analysis is performed in a similar manner as described above.

In another example embodiment (also not shown) the aperture 208 is positioned directly in the back focal plane of the objective 204. The beam splitters 205 and 206 could be removable, or a three-position slider could be used to let light pass unfettered to a detector 212, wherein the beam splitter or mirror is moved into place during navigation. Alternatively, a movable, high reflectivity mirror can be positioned into the light path to direct the light towards the aperture, and none to the camera and the MCP-PMT during emission analysis. The mirror is removed from the light path for navigation with the camera or for global acquisition.

The placement of the aperture in the back focal plane of the objective, such as described above, and coupling the APD detector thereto with fiber optic cable effectively positions the detector in the focal plane of the objective. This provides enhanced spatial resolution that is limited only by the NA of the objective. In an alternative example embodiment, the fiber optic cable itself is placed in the back focal plane and used to obtain an image for use by the APD.

Figure 3:
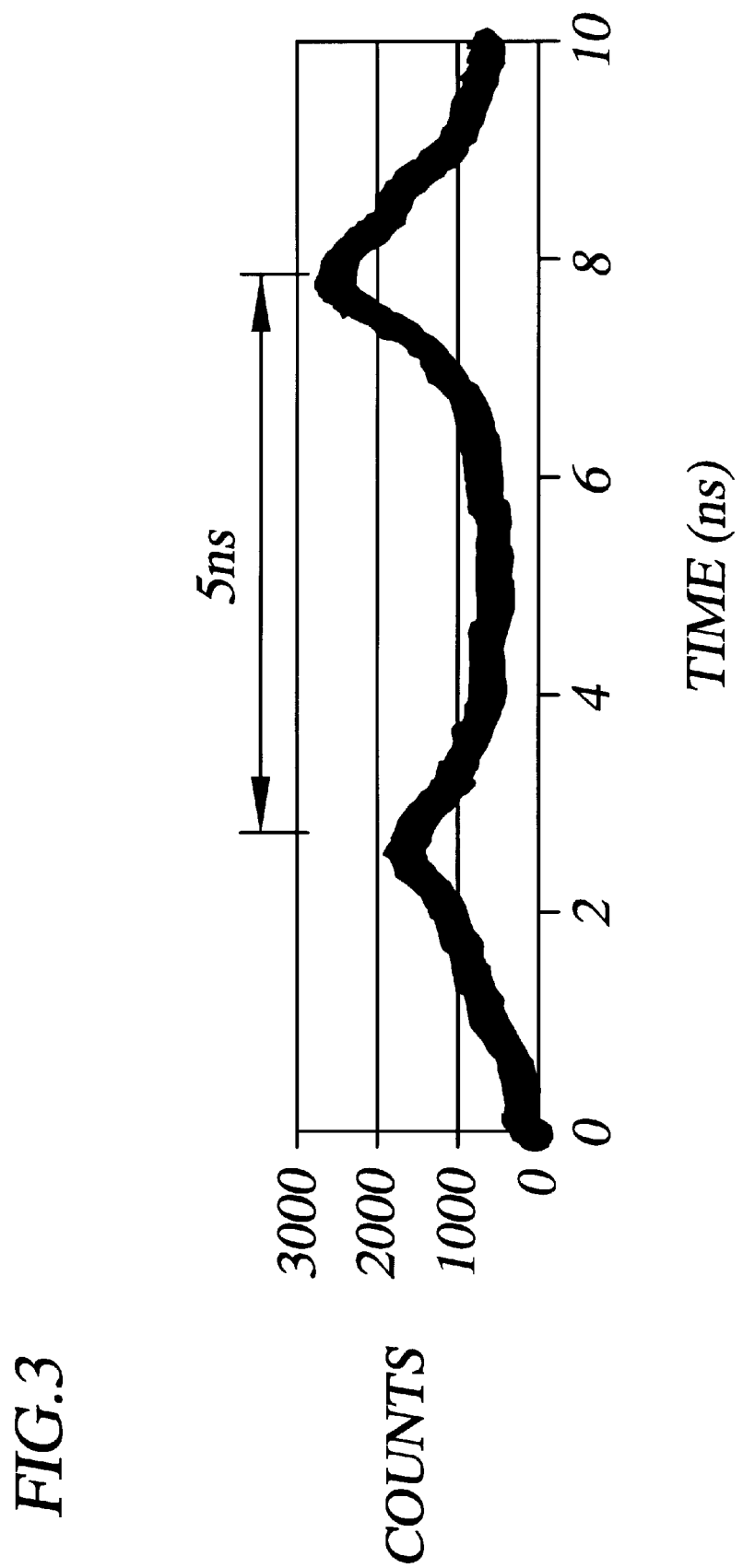
FIG. 3 is an example histogram, created in connection with an example embodiment of the present invention.

FIG. 3 shows an example histogram generated from a DUT using conventional TCSPC techniques in connection with an example embodiment of the present invention. The example histogram of FIG. 3 was compiled from a DUT that outputs a clock pulse every 2 ns, wherein each data point in the graph represents a count of photoemission events detected in a 12.5 ps interval.

The 5 ns interval between the peaks in the histogram illustrates the time interval between transitions of two inverters at an end of a ring oscillator. Given that the cycle time for an inverter is 10 ns in the example system, and photons are emitted only once during a cycle (e.g., going from a high logic level to a low logic level, but not in the transition from a low logic level to a high logic level), photons will be emitted every 5 ns by the two adjacent inverters.

Once photoemission data is collected, such as the example data of FIG. 3, timing specifications for the DUT can be analyzed and compared to the photoemission data to determine whether the circuit is functioning as expected. This data can be used, for example, to determine a characteristic of a particular transistor in the DUT.

While the present invention has been described with reference to several particular example embodiments, those skilled in the art will recognize that many changes may be made thereto without departing from the spirit and scope of the present invention, which is set forth in the following claims.

What is claimed is:

1. An integrated system adapted to analyze a semiconductor device under test (DUT), the system comprising:

a microscope having an objective lens adapted to focus an image of the DUT;

a navigation sensor coupled to the microscope and adapted to use the focused image to navigate over the DUT and locate a selected portion of the DUT for analysis;

a global acquisition sensor coupled to the microscope and adapted to receive at least a portion of the focused image;

a single-point acquisition sensor coupled to the microscope and adapted to receive at least a portion of the focused image, wherein the global acquisition sensor and the single-point acquisition sensor are adapted to acquire data both individually and simultaneously.

2. The system of claim 1, wherein the global acquisition sensor is adapted to obtain timing information over the entire field of view of the objective lens.

3. The system of claim 1, wherein the global acquisition sensor includes a position-sensitive MCP-PMT type sensor.

4. The system of claim 1, wherein the single point acquisition sensor is adapted to obtain timing information from a single transistor.

5. The system of claim 1, wherein the navigation sensor includes a nIR camera.

6. The system of claim 1, further comprising a navigation beam splitter adapted to direct a portion of the beam to the navigation sensor.

7. The system of claim 6, wherein the navigation beam splitter includes a three position slider adapted to function in beam split, mirror, and pass-through modes.

8. The system of claim 1, further comprising a testing arrangement adapted to hold the DUT.

9. The system of claim 8, wherein the testing arrangement includes excitation means for providing a signal to the DUT.

10. The system of claim 8, wherein the testing arrangement includes an output port coupled to the DUT and adapted to provide an output signal from the DUT.

11. The system of claim 1, further comprising a timer circuit coupled to a timing input from the global acquisition sensor and from the single-point acquisition sensor and arranged to couple to the DUT to provide an output signal indicative of time expired between occurrence of a signal from the DUT and a signal from at least one of the sensors.

12. The system of claim 11, wherein the timer circuit includes a time-to-amplitude converter.

13. The system of claim 11, further comprising a computer coupled to the timer circuit and adapted to record the output signal.

14. The system of claim 13, wherein the computer is further adapted to receive and record position data from position data inputs coupled to the global sensor.

15. The system of claim 13, wherein the computer includes an analog-to-digital converter (ADC) adapted to convert the output signal from analog to digital.

16. The system of claim 15, further comprising a multi-channel analyzer (MCA) board coupled to the ADC and adapted to facilitate the recording of a histogram of photon arrival times between the output signal from the DUT and a signal from at least one of the sensors.

17. The system of claim 1, wherein the single-point acquisition sensor includes an APD detector.

18. The system of claim 17, wherein the single-point acquisition sensor comprises:

a fiber optic cable; and an APD with single photon sensitivity.

19. The system of claim 18, further comprising a fiber optic switching element adapted to accommodate an MCP-PMT having a 25 ps detector.

20. The system of claim 18, wherein the fiber optic cable is located at a backfocal plane of the objective lens.

21. The system of claim 18, further comprising a fiber optic switching element adapted to accommodate high quantum efficiency (Q.E.) APD devices.

22. The system of claim 21, wherein the fiber optic switching element is adapted to accommodate at least one of: a GaAs APD; a Ge APD; and a InGaAs APD.

23. The system of claim 18, further comprising:

an aperture positioned before the fiber optic cable; and a beam splitter positioned over the objective lens and adapted to split the image passed through the objective lens and to direct the image at the aperture.

24. The system of claim 23, wherein the beam splitter includes a three-position slider adapted to function in beam split, mirror, and pass-through modes.

25. The system of claim 23, wherein the fiber optic cable, the aperture, the beam splitter, and the objective lens are positioned in a manner such that light from only a single transistor is transmitted through the fiber optic cable.

26. The system of claim 23, wherein the aperture includes a pin hole aperture having an opening that matches the resolution of the objective lens.

27. A system for analyzing a semiconductor device under test (DUT), the system comprising:

focusing means for focusing an image of at least a portion of the DUT;

navigation means coupled to the focusing means and adapted for navigating over the DUT and selecting a portion of the DUT for analysis;

global acquisition means coupled to the focusing means and adapted for acquiring global emission data from the focused image; and single-point acquisition means coupled to the focusing means and adapted for acquiring single-point emission data from the focused image, wherein the global acquisition means and the single-point acquisition means are adapted for acquiring data both individually and simultaneously.

28. A method for analyzing a semiconductor device under test (DUT) using an integrated system having a microscope including an objective, a navigation sensor, a global sensor, and a single-point sensor, the method comprising:

directing the microscope at the DUT and focusing an image of the DUT;

using the focused image, navigating over the DUT with the navigation sensor and selecting a portion of the DUT for analysis;

using the global sensor and acquiring global emission data from the DUT via the focused image; and using the single-point sensor and acquiring single-point emission data from the DUT via the focused image, wherein the integrated system is adapted to use the navigation sensor, the global sensor, and the single-point sensor individually and simultaneously.

29. The method of claim 28, further comprising exciting the DUT.

30. The method of claim 28, wherein acquiring global emission data from the DUT via the focused image comprises arranging a position sensitive MCP-PMT and obtaining timing information over the entire field of view of the objective.

31. The method of claim 28, further comprising arranging the DUT in a testing arrangement.

32. The method of claim 28, wherein acquiring single-point emission data from the DUT via the focussed image comprises:

arranging a fiber optic cable at a backfocal plane of the objective lens; and arranging a fast detector at the end of the fiber optic cable.

33. The method of claim 32, wherein arranging a fast detector at the end of the fiber optic cable includes arranging an APD with single photon sensitivity at the end of the fiber optic cable.

34. The method of claim 28, further comprising inputting the acquired global and single-point emission data into standard timing electronics adapted to record a histogram of photon arrival times between a DUT trigger signal and a detected photon.

35. The method of claim 34, wherein the standard timing electronics record the histogram using a multi-channel-analyzer (MCA).

36. The method of claim 28, further comprising inserting at least one beam splitter in the path of the focused image and over the objective lens and splitting the beam.

37. The method of claim 36, wherein a portion of the spit beam is used for acquiring global emission date, and another portion of the split beam is simultaneaously used for acquiring single-point emission data.

38. The method of claim 36, further comprising:

removing the at least one beam splitter after the single-point emission data is obtained; and acquiring global emission data after the beam splitter has been removed.

39. The method of claim 36, further comprising placing an aperture in the path of a split portion of the focused image after the beam splitter and before the single-point sensor.

40. The method of claim 36, wherein inserting a beam splitter in the path of the image includes inserting a three-position slider having beam splitter, mirror, and pass-through modes in the path of the image.

* * * * *